United States Patent [19]

Higgins et al.

[11] Patent Number: 5,466,535
[45] Date of Patent: Nov. 14, 1995

[54] POLYMERIC FILM

[75] Inventors: David E. Higgins, Whitby; Martin Wright, Bishop Auckland, both of United Kingdom

[73] Assignee: Imperial Chemical Industries PLC, London, England

[21] Appl. No.: 76,590

[22] Filed: Jun. 15, 1993

[30] Foreign Application Priority Data

Jun. 17, 1992 [GB] United Kingdom ............... 9212838

[51] Int. Cl.⁶ .................. B32B 27/36; B32B 27/08; B32B 27/30; C08K 5/12
[52] U.S. Cl. .................. 428/483; 428/516; 428/518; 428/207; 524/296; 524/297; 526/328.5; 526/329.7
[58] Field of Search .................. 428/480, 483, 428/500, 515, 518, 353, 207, 195, 516, 343, 354, 294; 524/295, 296, 297; 526/329.7, 328.5, 319; 427/412.5; 156/332

[56] References Cited

U.S. PATENT DOCUMENTS

| | | | |
|---|---|---|---|
| Re. 24,906 | 12/1960 | Urlich .................. | 206/59 |
| 2,794,742 | 6/1957 | Fowler, Jr. et al. .................. | 96/87 |
| 3,460,982 | 8/1969 | Appelbaum .................. | 117/138.8 |
| 3,819,773 | 6/1974 | Pears .................. | 264/37 |
| 4,098,952 | 7/1978 | Kelly et al. .................. | 428/483 |
| 4,208,468 | 6/1980 | Cunningham et al. .................. | 428/315 |
| 4,214,035 | 7/1980 | Heberger .................. | 428/340 |
| 4,371,489 | 2/1983 | McGrail .................. | 264/129 |
| 4,397,989 | 8/1983 | Adesko .................. | 525/162 |
| 4,571,363 | 2/1986 | Culbertson et al. .................. | 428/332 |
| 4,880,700 | 11/1989 | Charmot et al. .................. | 428/337 |
| 4,902,557 | 2/1990 | Rohrbacher .................. | 428/215 |
| 4,902,577 | 2/1990 | Butters et al. .................. | 428/483 |
| 5,028,484 | 7/1991 | Martin et al. .................. | 428/352 |
| 5,096,784 | 3/1992 | Culbertson et al. .................. | 428/482 |
| 5,130,189 | 7/1992 | Hart .................. | 428/331 |
| 5,283,152 | 2/1994 | Feldman et al. .................. | 430/138 |

FOREIGN PATENT DOCUMENTS

| | | |
|---|---|---|
| 000421 | 1/1979 | European Pat. Off. . |
| 417946 | 8/1990 | European Pat. Off. . |
| 477708 | 4/1992 | European Pat. Off. . |
| 779687 | 7/1957 | United Kingdom . |
| 838708 | 6/1990 | United Kingdom . |

*Primary Examiner*—Paul J. Thibodeau
*Assistant Examiner*—Vivian Chen
*Attorney, Agent, or Firm*—Cushman Darby & Cushman

[57] ABSTRACT

A polymeric film has a polyester substrate layer and a cross-linked adherent layer of an acrylic resin and a phthalate ester. The adherent layer exhibits improved adhesion to the substrate and to a range of subsequently applied layers, such as inks, lacquers, and vinyl chloride polymers.

13 Claims, 1 Drawing Sheet

POLYMERIC FILM

This invention relates to a coated polyester film, and in particular to a product made therefrom.

A polyester film is often used with other materials, for example by coating or laminating polyester film to form a laminate or composite which exhibits improved properties, compared to the component materials. It is well known in the art that many coating or adhesive compositions do not adhere well to polyester film. In addition, inks and lacquers do not generally adhere well to polyester film. Consequently, it is desirable to improve such properties by providing an adherent layer of an appropriate coating medium on the surface of polyester film. An adherent layer material is chosen which is generally more receptive to subsequently applied coating layers than polyester film per se. Problems may be encountered in providing adequate adhesion between the adherent layer and a polyester film substrate, particularly a relatively hydrophobic substrate such as a polyethylene terephthalate film. Acrylic coating systems have been routinely used in the art as adherent layers on polyester film. Unfortunately, prior art acrylic adherent layers may suffer from the aforementioned adhesion problem. There is also a need to improve the adhesion of acrylic adherent layers to a range of additionally applied coating layers.

We have now devised a polyester film coated with an adherent layer which exhibits improved adhesion between the polyester film and adherent layer, and with at least one subsequently applied additional layer.

Accordingly, the present invention provides a polymeric film comprising a substrate layer of polyester material having on at least one surface thereof an adherent layer comprising an acrylic resin and a phthalate ester.

The invention also provides a method of producing a polymeric film by forming a substrate layer of polyester material, and applying to at least one surface thereof an adherent layer comprising an acrylic resin and a phthalate ester.

A substrate for use in the production of an adherent layer coated polymeric film according to the invention suitably comprises any polyester material capable of forming a self-supporting opaque, or preferably transparent, film or sheet.

By a "self-supporting film or sheet" is meant a film or sheet capable of independent existence in the absence of a supporting base.

The substrate of an adherent layer coated film according to the invention may be formed from any synthetic, film-forming, polyester material. Suitable thermoplastic, synthetic, materials include a synthetic linear polyester which may be obtained by condensing one or more dicarboxylic acids or their lower alkyl (up to 6 carbon atoms) diesters, e.g. terephthalic acid, isophthalic acid, phthalic acid, 2,5-, 2,6- or 2,7-naphthalenedicarboxylic acid, succinic acid, sebacic acid, adipic acid, azelaic acid, 4,4'-diphenyldicarboxylic acid, hexahydro-terephthalic acid or 1,2-bis-p-carboxyphenoxyethane (optionally with a monocarboxylic acid, such as pivalic acid) with one or more glycols, particularly an aliphatic glycol, e.g. ethylene glycol, 1,3-propanediol, 1,4-butanediol, neopentyl glycol and 1,4-cyclohexanedimethanol. A polyethylene terephtalate film or a polyethylene naphthalate film is preferred. A polyethylene terephthalate film is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example—as described in British patent 838,708.

The polyester film substrate for production of a coated film according to the invention may be unoriented, or uniaxially oriented, but is preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, ie the forward direction through the film stretching machine, and then in the transverse direction. A stretched polyester substrate film may be, and preferably is, dimensionally stabilised by heat-setting under dimensional restraint at a temperature above the glass transition temperature thereof.

The substrate is suitably of a thickness from 6 to 300, particularly from 10 to 250, and especially from 100 to 175 µm.

By "acrylic resin" is meant a resin which comprises at least one acrylic and/or methacrylic component.

The acrylic resin component of the coating layer of a film according to the invention is preferably thermoset and preferably comprises at least one monomer derived from an ester of acrylic acid and/or an ester of methacrylic acid, and/or derivatives thereof. In a preferred embodiment of the invention, the acrylic resin comprises greater than 50 mole %, preferably less than 98 mole %, more preferably from 60 to 97 mole %, especially from 70 to 96 mole %, and particularly from 80 to 94 mole % of at least one monomer derived from an ester of acrylic acid and/or an ester of methacrylic acid, and/or derivatives thereof. A preferred acrylic resin for use in the present invention preferably comprises an alkyl ester of acrylic and/or methacrylic acid where the alkyl group contains up to ten carbon atoms such as methyl, ethyl, n-propyl, isopropyl, n-butyl, isobutyl, terbutyl, hexyl, 2-ethylhexyl, heptyl, and n-octyl. Polymers derived from an alkyl acrylate, for example ethyl acrylate and butyl acrylate, together with an alkyl methacrylate are preferred. Polymers comprising ethyl acrylate and methyl methacrylate are particularly preferred. The acrylate monomer is preferably present in a proportion in the range 30 to 65 mole %, and the methacrylate monomer is preferably present in a proportion in the range of 20 to 60 mole %.

Other monomers which are suitable for use in the preparation of the acrylic resin of the adherent layer, which may be preferably copolymerised as optional additional monomers together with esters of acrylic acid and/or methacrylic acid, and/or derivatives thereof, include acrylonitrile, methacrylonitrile, halo-substituted acrylonitrile, halo-substituted methacrylonitrile, acrylamide, methacrylamide, N-methylol acrylamide, N-ethanol acrylamide, N-propanol acrylamide, N-methylacrylamide, N-ethanol methacrylamide, N-methyl acrylamide, N-tertiary butyl acrylamide, hydroxyethyl methacrylate, glycidyl acrylate, glycidyl methacrylate, dimethylamino ethyl methacrylate, itaconic acid, itaconic anhdyride and half esters of itaconic acid.

Other optional monomers of the acrylic resin adherent layer polymer include vinyl esters such as vinyl acetate, vinyl chloracetate and vinyl benzoate, vinyl pyridine, vinyl chloride, vinylidene chloride, maleic acid, maleic anhydride, styrene and derivatives of styrene such as chloro styrene, hydroxy styrene and alkylated styrenes, wherein the alkyl group contains from one to ten carbon atoms.

A preferred acrylic resin, derived from 3 monomers comprises 35 to 60 mole % of ethyl acrylate/30 to 55 mole % of methyl methacrylate/2 to 20 mole % of methacrylamide, and especially comprising approximate molar proportions 46/46/8% respectively of ethyl acrylate/methyl methacrylate/acrylamide or methacrylamide, the latter polymer being particularly effective when thermoset—for example, in the presence of about 25 weight % of a methylated melamine-formaldehyde resin.

A preferred acrylic resin, derived from 4 monomers comprises a copolymer comprising comonomers (a) 35 to 40 mole % alkyl acrylate, (b) 35 to 40 mole % alkyl methacrylate, (c) 10 to 15 mole % of a monomer containing a free carboxyl group, and (d) 15 to 20 mole % of an aromatic sulphonic acid and/or a salt thereof. Ethyl acrylate is a particularly preferred monomer (a) and methyl methacrylate is a particularly preferred monomer (b). Monomer (c) containing a free carboxyl group ie carboxyl group other than those involved in the polymerisation reaction by which the copolymer is formed, suitably comprises a copolymerisable unsaturated carboxylic acid, and is preferably selected from acrylic acid, methacrylic acid, maleic acid, and/or itaconic acid; with acrylic acid and itaconic acid being particularly preferred. The aromatic sulphonic acid monomer (d) may be present as the free acid and/or a salt thereof, for example as the ammonium, substituted ammonium, or an alkali metal, such as lithium, sodium or potassium, salt. The sulphonate group does not participate in the polymerisation reaction by which the adherent copolymer resin is formed. The aromatic sulphonic acid monomer is preferaby p-styrene sulphonic acid and/or a salt thereof.

The weight average molecular weight of the acrylic resin can vary over a wide range but is preferably within the range 10,000 to 10,000,000, and more preferably within the range 50,000 to 200,000.

The acrylic resin preferably comprises at least 30% by weight of the layer and, more preferably, between 40% and 99%, particularly between 50% and 80%, and especially between 70% and 80% by weight relative to the total weight of the adherent layer. The acrylic resin is generally water-insoluble. The coating composition including the water-insoluble acrylic resin may nevertheless be applied to the polymeric film substrate as an aqueous dispersion.

A phthalate ester for incorporation into an adherent coating layer according to the invention preferably has the general structure

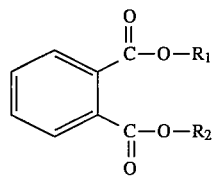

wherein $R_1$ and $R_2$, which may be the same or different, preferably represent an alkyl group, optionally substituted, a cyclohexyl group, a benzyl group and/or a phenyl group. When $R_1$ and/or $R_2$ represent an alkyl group, the alkyl group preferably contains up to 20, more preferably up to 10, particularly from 3 to 9, and especially from 6 to 8 carbon atoms. The alkyl group may be a straight chain or preferably branched, preferably containing one branch. $R_1$ and/or $R_2$ may comprise more than one alkyl group linked by one or more ether groups, for example ethoxyethyl or butoxyethyl groups. In a preferred embodiment of the invention $R_1$ is an alkyl group, preferably containing up to 10 carbon atoms, and $R_2$ is a benzyl group or a phenyl group, preferably a benzyl group.

Suitable phthalate esters include dimethyl phthalate, diethyl phthalate, dibutyl phthalate, diisohexyl phthalate, butyl 2-ethylhexyl phthalate, di-2-ethylhexyl phthalate, diisooctyl phthalate, dicapryl phthalate, heptyl nonyl phthalate, diisononyl phthalate, butyl isodecyl phthalate, n-octyl n-decyl phthalate, diisodecyl phthalate, heptyl nonyl undecyl phthalate, diundecyl phthalate, ditridecyl phthalate, diallyl phthalate, butyl cyclohexyl phthalate, dicyclohexyl phthalate, diphenyl phthalate, butyl benzyl phthalate, cyclohexyl benzyl phthalate, 7-(2,6,6,8-tetramethyl-4-oxa-3-oxononyl)benzyl phthalate, methoxyethoxyethyl benzyl phthalate, dimethoxyethyl phthalate, diethoxyethoxyethyl phthalate and dibutoxyethyl phthalate. A particularly preferred phthalate ester is benzyl 2-ethylhexyl phthalate.

In order to optimise the compatibility of the phthalate ester with the acrylic resin it is prefered that the phthalate ester has a dielectric constant in the range from 3.0 to 8.0, more preferably from 4.5 to 7.5, and particularly from 5.0 to 6.5.

The molecular weight of the phthalate ester is preferably less than 5000, more preferably less than 1000, particularly in the range from 200 to 600, and especially from 300 to 400.

The phthalate ester should preferably be present in the adherent layer in the range from 0.05% to 20%, more preferably from 0.1% to 10%, particularly from 0.5% to 5%, and especially from 0.8% to 2.0% by weight relative to the total weight of the adherent layer.

The invention is not limited to the addition of a single phthalate ester, and, if desired, two or more different phthalate esters may be present in the adherent layer.

If desired, the adherent layer coating composition may also contain a cross-linking agent which functions to cross-link the layer thereby improving adhesion to the polyester film substrate. Additionally, the cross-linking agent should preferably be capable of internal cross-linking in order to provide protection against solvent penetration. Suitable cross-linking agents may comprise epoxy resins, alkyd resins, amine derivatives such as hexamethoxymethyl melamine, and/or condensation products of an amine, e.g. melamine, diazine, urea, cyclic ethylene urea, cyclic propylene urea, thiourea, cyclic ethylene thiourea, alkyl melamines, aryl melamines, benzo guanamines, guanamines, alkyl guanamines and aryl guanamines, with an aldehyde, e.g. formaldehyde. A useful condensation product is that of melamine with formaldehyde. The condensation product may optionally be alkoxylated. The cross-linking agent may suitably be used in amounts of up to 60%, preferably up to 50%, more preferably in the range from 20% to 45% by weight relative to the total weight of the adherent layer. A catalyst is also preferably employed to facilitate cross-linking action of the cross linking agent. Preferred catalysts for cross-linking melamine formaldehyde include para toluene sulphonic acid, maleic acid stabilised by reaction with a base, morpholinium paratoluene sulphonate, and ammonium nitrate.

The adherent layer coating composition may be applied before, during or after the stretching operation in the production of an oriented film. The adherent layer coating composition is preferably applied to the film substrate between the two stages (longitudinal and transverse) of a thermoplastics polyester film biaxial stretching operation.

Such a sequence of stretching and coating is suitable for the production of an adherent layer coated linear polyester film, particularly polyethylene terephthalate film, substrate, which is preferably firstly stretched in the longitudinal direction over a series of rotating rollers, coated, and then stretched transversely in a stenter oven, preferably followed by heat setting.

An adherent layer coated polyester, especially polyethylene terephthalate, substrate is suitably heated from 150° C. to 240° C., preferably from 200° C. to 220° C., in order to dry the aqueous medium, or the solvent in the case of solvent-applied compositions, and also to assist in coalescing and forming the coating into a continuous and uniform layer. The cross-linking of cross-linkable coating compositions is also achieved at such temperatures.

The adherent layer coating composition is preferably applied to the polyester film substrate by any suitable conventional technique such as dip coating, bead coating, reverse roller coating or slot coating.

The ratio of substrate to adherent layer thickness may vary within a wide range, although the thickness of the adherent layer suitably should not be less than 0.001% nor greater than 10% of that of the substrate, and is preferably in the range from 0.002% to 5%, more preferably 0.004% to 0.5% of the substrate.

The adherent layer is preferably applied to the polyester substrate at a coat weight within the range 0.05 to 10 mgdm$^{-2}$, especially 0.1 to 2.0 mgdm$^{-2}$. For films coated on both surfaces, each adherent layer preferably has a coat weight within the preferred range.

Prior to deposition of the adherent layer onto the polyester substrate, the exposed surface thereof may, if desired, be subjected to a chemical or physical surface-modifying treatment to improve the bond between that surface and the subsequently applied adherent layer. A preferred treatment, because of its simplicity and effectiveness, is to subject the exposed surface of the substrate to a high voltage electrical stress accompanied by corona discharge. Alternatively, the substrate may be pretreated with an agent known in the art to have a solvent or swelling action on the polyester substrate, for example a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

One or more of the layers of a polymeric film according to the invention, ie substrate, adherent or additional coating layer(s), may conveniently contain any of the additives conventionally employed in the manufacture of polymeric films. Thus, agents such as dyes, pigments, voiding agents, lubricants, anti-oxidants, anti-blocking agents, surface active agents, slip aids, gloss-improvers, prodegradants, ultra-violet light stabilisers, viscosity modifiers and dispersion stabilisers may be incorporated in the substrate and/or coating layer(s), as appropriate. In particular, a polyester substrate may comprise a particulate filler, such as silica, of small particle size. Desirably, a filler, if employed in a substrate layer, should be present in a small amount, not exceeding 0.5%, preferably less than 0.2%, by weight of the substrate. In one embodiment of the invention a filler is present in the adherent layer, preferably at a concentration in the range from 0.01% to 2%, more preferably 0.03% to 1%. Silica is a suitable filler, preferably having an average particle size in the range from 0.005 μm to 2.0 μm, more preferably in the range from 0.3 μm to 0.7 μm.

Adherent layer coated polymeric films of the present invention can be used to form various types of composite structures by coating or laminating additional materials onto the adherent layer coated substrate film. For example the adherent layer coated polymeric films may exhibit good adhesion when laminated with metal foils such as copper, aluminium and nickel, which can be used to form circuit boards. Vacuum bag lamination, press lamination, roll lamination or other standard lamination techniques can be utilised to form the aforementioned laminates.

Deposition of a metallic layer onto the, or each, adherent layer may be effected by conventional metallising techniques—for example, by deposition from a suspension of finely-divided metallic particles in a suitable liquid vehicle, or, preferably, by a vacuum deposition process in which a metal is evaporated onto the adherent resin surface in a chamber maintained under conditions of high vacuum. Suitable metals include palladium, nickel, copper (and alloys thereof, such as bronze), silver, gold, cobalt and zinc, but aluminium is to be preferred for reasons both of economy and ease of bonding to the resin layer.

Metallising may be effected over the entire exposed surface of the adherent layer or over only selected portions thereof, as desired.

Metallised films may be prepared in a range of thicknesses governed primarily by the ultimate application for which a particular film is to be employed.

A lacquer layer may be applied over the adherent layer to produce a film suitable for use as a drafting film. The lacquer layer preferably comprises one or more polyvinyl alcohol and/or polyvinyl acetal resins. Polyvinyl acetal resins can be suitably prepared by reacting polyvinyl alcohols with aldehydes. Commercially available polyvinyl alcohols are generally prepared by hydrolysing polyvinyl acetate. Polyvinyl alcohols are usually classified as partially hydrolysed (comprising 15 to 30% polyvinyl acetate groups) and completely hydrolysed (comprising 0 to 5% polyvinyl acetate groups). Both types of polyvinyl alcohols, in a range of molecular weights, are used in producing commercially available polyvinyl acetal resins. The conditions of the acetal reaction and the concentration of the particular aldehyde and polyvinyl alcohol used will determine the proportions of hydroxyl groups, acetate groups and acetal groups present in the polyvinyl acetal resin. The hydroxyl, acetate and acetal groups are generally randomly distributed in the molecule. Suitable polyvinyl acetal resins include polyvinyl butyral, and preferably polyvinyl formal.

The lacquer layer preferably additionally comprises finely divided particulate material. When the polymeric film is to be used as a drafting material, the particulate material employed should impart a surface roughness to the film surface which can be marked and will retain the impressions of writing implements such as pencils, crayons and ink.

The finely divided particulate material may be selected from silica, silicates, ground glass, chalk, talc, diamotaceous earth, magnesium carbonate, zinc oxide, zirconia, calcium carbonate and titanium dioxide. Finely divided silica is the preferred material for the production of drafting materials, together with which smaller quantities of the other materials may be incorporated, to obtain the required degree of translucency and to increase the toughness and mark resistance of the coating. Desirably, a filler, if employed in a lacquer layer, should be present in an amount of not exceeding 50% by weight of polymeric material, and the average particle size thereof should not exceed 15 μm, preferably less than 10 μm, and especially from 0.1 to 5 μm.

The adherent layer coated films can be coated with a range of other organic and/or aqueous solvent based inks and lacquers, for example additional acrylic coatings, cellulose acetate butyrate lacquer, and diazonium coatings for drawing office applications. A variety of UV and solvent based inks can be adhered to polymeric films according to the invention, for example for use in the manufacture of a membrane touch switch.

A membrane touch switch is usually constructed from three or four layers of polymeric film. A typical switch will have a graphics layer, beneath which are two membranes or circuitry layers, each screen printed with conducting ink circuitry, separated by a spacer film with die cut holes. Contact between the circuits is achieved by finger pressure over the die cut holes. The graphics layer is usually reverse printed, and a wide variety of UV-cured inks and lacquers, and solvent inks and lacquers are used. There is therefore a need for the graphics layer to have good adhesion to a wide spectrum of inks and lacquers. Adherent layer coated films according to the invention are particularly suitable for use as a graphics layer, or alternatively as a circuitry layer, in a membrane touch switch.

The adherent layer coated films can also be coated with photographic emulsions, such as light-sensitive gelatinous silver halide emulsions, especially conventional X-ray emulsions. The light-sensitive emulsion may optionally include any of the conventional additives normally used therein.

The adherent layer coated films can also be used to form magnetic cards, such as credit cards, and in particular a "pre-paid card", e.g. a telephone card, and an "intelligent card" capable, for example, of storing information relating to a number of financial transactions. A magnetic card preferably comprises, in order, (i) a magnetic layer, (ii) an adherent layer comprising an acrylic resin and a phthalate ester, (iii) a polyester substrate layer, (iv) an adherent layer as defined in (ii) above, and (v) a graphics layer.

A range of conventional binders may be used for the magnetic coating materials, which are well known to the man skilled in the art. A wide range of inks and lacquers may be used in the graphics layer, such as aqueous and organic solvent-based materials, particularly electron beam- and other UV-curable inks.

The adherent layer coated films can be coated with a vinyl chloride polymer layer to form a polyester/vinyl chloride polymer laminate. The vinyl chloride polymer may be a homopolymer or a copolymer containing at least 50 mole %, preferably at least 80 mole %, of polymerised vinyl chloride. The layer of vinyl chloride polymer may be formed on the adherent layer coated polyester film by any suitable technique. For example, a plastisol or an organosol derived from a vinyl chloride polymer can be coated onto the adherent layer coated polyester film, and heated to gel the plastisol or the organosol (after removal of the diluent) into a coherent layer. Pressure may also be applied, or alternatively the plastisol may be embossed. The plastisol may be foamable, so that a foamed vinyl chloride polymer layer is formed.

In an alternative method, a preformed vinyl chloride polymer film and an adherent layer coated polyester film are fed through hot rollers in order to bond the films together to form a laminate.

The polyester/vinyl chloride polymer laminate can be used as cushioned flooring, solid (ie unfoamed) wall and floor tiles, identification cards, cladding, and adhesive tapes in packaging and electrical applications.

In a preferred embodiment of the invention, the polyester/vinyl chloride polymer laminate can be used in making a floor covering, such as a floor tile. The floor tile comprises in order a vinyl chloride polymer film/an ink layer/adherent layer/polyester substrate layer (the latter two layers forming the polymeric film according to the invention). The adherent layer, as defined herein, provides surprisingly improved adhesion between the ink layer and the polyester substrate. The ink layer provides the decorative pattern on the floor tile. The ink layer preferably comprises a vinyl chloride/acrylic ink.

BRIEF DESCRIPTION OF DRAWINGS

The invention is illustrated by reference to the accompanying drawings in which:

Referring to FIG. 1 of the drawings, the film comprises a polymeric substrate layer (1) having an adherent layer (2) bonded to one surface (3) thereof.

Figure 1:
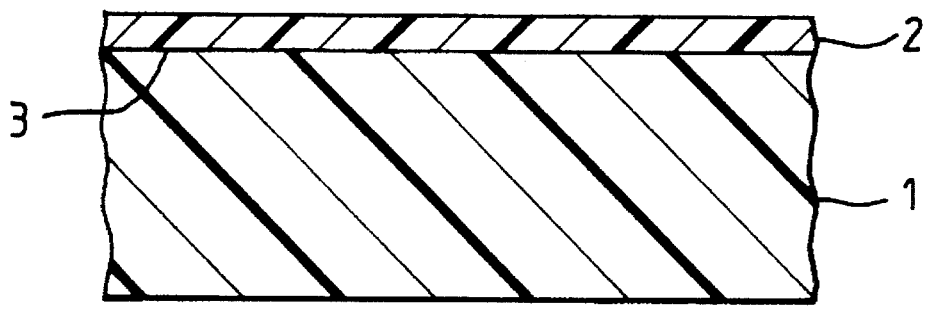
FIG. 1 is a schematic sectional elevation, not to scale, of a polymeric film having a substrate and adherent layer.
Figure 2:
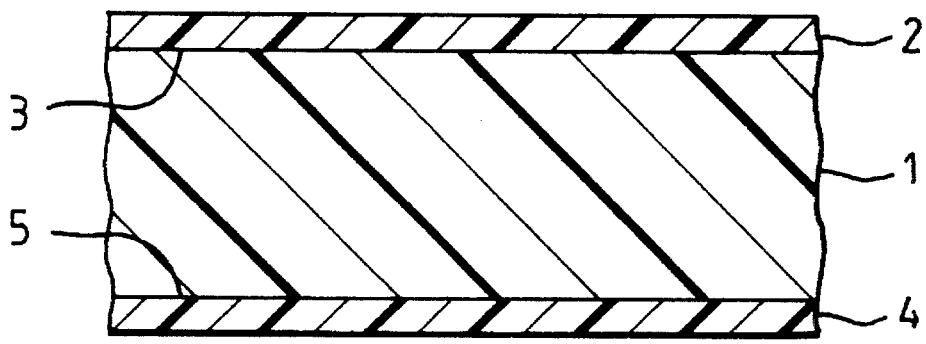
FIG. 2 is a similar schematic elevation of a coated film with an additional adherent layer on the remote surface of the substrate.

The film of FIG. 2 further comprises an additional adherent layer (4), bonded to the second surface (5) of the substrate (1).

Figure 3:
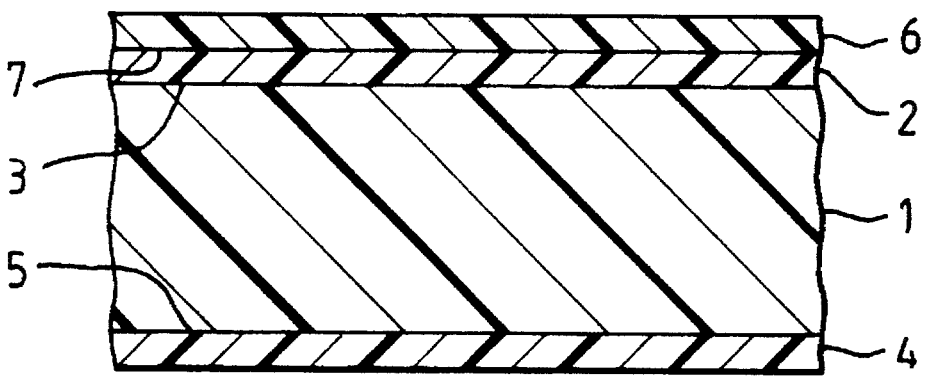
FIG. 3 is a similar schematic elevation of a film as shown in FIG. 2, with an additional coating layer on the remote surface of one of the adherent layers.

The film of FIG. 3 further comprises an additional coating layer (6), bonded to the remote surface (7) of the adherent layer (2).

The invention is further illustrated by reference to the following examples.

Example 1

A polyethylene terephthalate film was melt extruded, cast onto a cooled rotating drum and stretched in the direction of extrusion to approximately 3.5 times its original dimensions. The monoaxially oriented polyethylene terephthalate substrate film was coated on one side with an adherent layer coating composition comprising the following ingredients:

| | |
|---|---|
| Acrylic resin (46% w/w aqueous latex of methyl methacrylate/ethyl acrylate/methacrylamide: 46/46/8 mole %, with 25% by weight methoxylated melamine-formaldehyde) | 163 ml |
| Santicizer 261 (*2% w/w aqueous dispersion) | 100 ml |
| Ammonium nitrate (10% w/w aqueous solution) | 6 ml |
| Synperonic NDB (13.7% w/w aqueous solution of a nonyl phenol ethoxylate, supplied by ICI) | 7 ml |
| Demineralised water | to 2.5 liters |

*prepared by adding 30 ml of Santicizer 261 (benzyl 2-ethylhexyl phthalate, supplied by Monsanto) to 120 ml of Synperonic NDB, stirring to form a white paste, adding 1350 ml demineralised water and stirring in a high speed mixer.

The coated film was passed into a stenter oven, where the film was stretched in the sideways direction to approximately 3.5 times its original dimensions. The coated biaxially stretched film was heat set at a temperature of about 220° C. by conventional means. Final film thickness was 125 μm. The dry coat weight of the adherent layer was approximately 0.4 mgdm$^{-2}$ and the thickness of the coating layer was approximately 0.4 μm.

The strength of adhesion of the adherent layer to the substrate was measured using the adhesion test described below.

The adherent layer of an A4 sheet of adherent layer coated film produced above was coated with Acheson 451 SS ink (a dielectric UV cured ink) using a No 3 Meyer bar. 25 mm strips of the same adherent layer coated film were placed, adherent layer down, on top of the ink to form a symmetrical laminate. The laminate was pressed by rolling thereon a 19 Kg cylindrical weight. The laminate was passed through a Primark UV curing machine. The upper 25 mm strip was then manually peeled away from the lower A4 sheet. The peel was difficult to perform and resulted in the initial peel surfaces being white due to substrate delamination, ie cohesive failure of the polyethylene terephthalate. This result indicates very good adhesion at both the ink/adherent layer interface and the adherent layer/substrate interface.

Example 2

This is a comparative example not according to the invention. The procedure of Example 1 was repeated except that the coating composition did not contain any Santicizer 261. In the adhesion test, the peel was easy to perform and resulted in the ink layer cleanly peeling away from one of the substrate layers, ie interfacial failure had occurred at the ink/adherent layer interface and/or the adherent layer/substrate interface. This result indicates poor adhesion.

Example 3

The adherent layer coated film produced in Example 1 was used to produce a vinyl chloride polymer laminate suitable for use as a floor tile, as described below.

The adherent layer of an A4 sheet of adherent layer coated film was coated with black ink (a vinyl chloride/acrylic ink) using a No 3 Meyer bar, and allowed to dry at room temperature for one hour. A 0.5 mm thick layer of a standard vinyl chloride polymer plastisol was coated, using a No 500 Meyer Bar, on top of the ink layer. After drying at 180° C. for 140 seconds, the assembly was placed in a press and 10 tonnes of pressure at 140° C. applied for 30 seconds. The resultant laminate was cut into 50 mm wide strips and the peel strength thereof determined using an Instron operating at a speed of 400 mm min$^{-1}$. The mean peel strength obtained was 45 N/50 mm. Cohesive failure of the ink layer occurred, indicating very good adhesion at the adherent layer/substrate interface.

Example 4

This is a comparative example not according to the invention. The procedure of Example 3 was repeated using adherent layer coated film produced in Example 2.

The mean peel strength obtained was 23 N/50 mm. Interfacial failure occurred at the adherent layer/substrate interface. The vinyl chloride polymer layer/ink layer/adhesive layer structure cleanly peeled away from the substrate (confirmed by surface analysis). This result indicates poor adhesion of the adherent layer to the substrate.

Example 5

The procedure of Example 3 was repeated, using the adherent layer coated film produced as in Example 1, except that the coating composition comprised the following ingredients:

| | |
|---|---|
| Acrylic resin (46% w/w aqueous latex of methyl methacrylate/ethyl acrylate/methacrylamide: 46/46/8 mole %, with 25% by weight methoxylated melamine-formaldehyde) | 163 ml |
| Santicizer 261 (*2% w/w aqueous dispersion) | 37.5 ml |
| Cymel 385 (10% w/w aqueous solution of melamine formaldehyde) | 234 ml |
| Ammonium nitrate (10% w/w aqueous solution) | 6 ml |
| Synperonic NDB (13.7% w/w aqueous solution of a nonyl phenol ethoxylate, supplied by ICI) | 12 ml |
| Demineralised water | to 2.5 liters |

*prepared by adding 30 ml of Santicizer 261 to 120 ml of Synperonic NDB, stirring to form a white paste, adding 1350 ml demineralised water and stirring in a high speed mixer.

The mean peel strength obtained was 51 N/50 mm. Cohesive failure of the ink layer occurred, indicating very good adhesion at the adherent layer/substrate interface.

Example 6

The procedure of Example 1 was repeated except that the adherent layer coating composition comprised 7.5 ml of a 20% aqueous dispersion of silica of average particle size 0.5 µm.

As in Example 1, the peel was difficult to perform in the adhesion test indicating very good adhesion at both the ink/adherent layer interface and the adherent layer/substrate interface.

The above examples illustrate the improved properties of adherent layer coated films of the present invention.

We claim:

1. In a polymeric film comprising a self supporting substrate layer of polyester material having on at least one surface thereof a cross-linked adherent layer comprising an acrylic resin, the improvement wherein said adherent layer includes a phthalate ester, the phthalate ester being present in an amount effective to improve the adhesion of said adherent layer to the substrate layer of polyester material.

2. A polymeric film according to claim 1 wherein the phthalate ester is present in the adherent layer in the range from 0.05% to 20% by weight relative to the total weight of the adherent layer.

3. A polymeric film according to claim 1 wherein the acrylic resin is present in the adherent layer in an amount of at least 30% by weight relative to the total weight of the adherent layer.

4. A polymeric film according to claim 3 wherein the acrylic resin comprises from 70 to 96 mole % of at least one monomer selected from the group consisting of an ester of acrylic acid, an ester of methacrylic acid, and mixtures derivatives thereof.

5. A polymeric film according to claim 4 wherein the acrylic resin comprises an alkyl acrylate and an alkyl methacrylate.

6. A polymeric film according to claim 5 wherein the amount of phthalate ester is in the range of 0.8 to 2.0% by weight relative to the total weight of the adherent layer and the phthalate ester has a dielectric constant in the range of 3.0 to 8.0.

7. A polymeric film according to claim 6 wherein the amount of phthalate ester is in the range of 0.8 to 2.0% by weight relative to the total weight of the adherent layer and the phthalate ester is selected from the group consisting of dimethyl phthalate, diethyl phthalate, dibutyl phthalate, diisohexyl phthalate, butyl 2-ethylhexyl phthalate, di-2-ethylhexyl phthalate, diisooctyl phthalate, dicapryl phthalate, heptyl nonyl phthalate, diisononyl phthalate, butyl isodecyl phthalate, n-octyl n-decyl phthalate, diisodecyl phthalate, heptyl nonyl undecyl phthalate, diundecyl phthalate, ditridecyl phthalate, diallyl phthalate, butyl cyclohexyl phthalate, dicyclohexyl phthalate, diphenyl phthalate, butyl benzyl phthalate, cyclohexyl benzyl phthalate, benzyl 2-ethylhexyl phthalate, 7-(2,6,6,8-tetramethyl-4-oxa-3-oxo-nonyl)benzyl phthalate, methoxyethoxyethyl benzyl phthalate, dimethoxyethyl phthalate, diethoxyethoxyethyl phthalate and dibutoxyethyl phthalate.

8. A polymeric film according to claim 7 wherein the phthalate ester is benzyl 2-ethylhexyl phthalate.

9. A polymeric film according to claim 1 wherein a vinyl chloride polymer layer is present on the surface of the adherent layer, remote from the polyester substrate layer.

10. A polymeric film according to claim 9 wherein an ink layer is present between the adherent layer and vinyl chloride polymer layer.

11. A polymeric film according to claim 1 wherein the phthalate ester has a molecular weight of from 300 to 400.

12. A polymeric film according to claim 1 wherein the amount of phthalate ester is in the range of 0.5 to 5% by weight relative to the total weight of the adherent layer.

13. A polymeric film comprising a substrate layer of polyester material having on at least one surface thereof a cross-linked adherent layer comprising an acrylic resin and a phthalate ester, the phthalate ester being present in the adherent layer in the range from 0.05% to 20% by weight relative to the total weight of the adherent layer, said phthalate ester functioning to improve the adhesion of the adherent layer to a subsequently applied vinyl chloride polymer layer.

* * * * *